US012702015B2

(12) United States Patent
Kondo et al.

(10) Patent No.: US 12,702,015 B2
(45) Date of Patent: Aug. 4, 2026

(54) SEMICONDUCTOR DEVICE

(71) Applicant: Murata Manufacturing Co., Ltd., Kyoto-fu (JP)

(72) Inventors: Masao Kondo, Nagaokakyo (JP); Satoshi Goto, Nagaokakyo (JP); Takayuki Tsutsui, Nagaokakyo (JP); Shinnosuke Takahashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 457 days.

(21) Appl. No.: 18/523,320

(22) Filed: Nov. 29, 2023

(65) Prior Publication Data

US 2024/0096824 A1 Mar. 21, 2024

Related U.S. Application Data

(63) Continuation of application No. PCT/JP2022/022186, filed on May 31, 2022.

(30) Foreign Application Priority Data

Jun. 11, 2021 (JP) ................................. 2021-098094

(51) Int. Cl.
*H03F 1/56* (2006.01)
*H01L 23/66* (2006.01)
(Continued)

(52) U.S. Cl.
CPC ............ *H10W 44/20* (2026.01); *H03F 1/565* (2013.01); *H03F 3/195* (2013.01); *H03F 3/245* (2013.01);
(Continued)

(58) Field of Classification Search
CPC ... H10W 44/20; H10W 90/00; H10W 44/206; H10W 44/234; H10W 90/20;
(Continued)

(56) References Cited

U.S. PATENT DOCUMENTS

| | | | |
|---|---|---|---|
| 7,511,315 B2 * | 3/2009 | Konishi | H10D 64/663 |
| | | | 257/737 |
| 7,962,105 B2 * | 6/2011 | Sato | H03F 3/195 |
| | | | 333/100 |
| 9,583,471 B2 | 2/2017 | Teeter et al. | |

FOREIGN PATENT DOCUMENTS

| | | |
|---|---|---|
| JP | H03-262143 A | 11/1991 |
| JP | H06-029428 A | 2/1994 |

(Continued)

OTHER PUBLICATIONS

International Search Report issued in PCT/JP2022/022186; mailed Aug. 23, 2022.

*Primary Examiner* — Hieu P Nguyen

(74) *Attorney, Agent, or Firm* — Studebaker Brackett PLLC

(57) ABSTRACT

A stacked semiconductor device capable of increasing heat dissipation comprises a first member and a second member. The first member includes a semiconductor substrate and a first electronic circuit. The first electronic circuit includes a semiconductor element provided on one surface of the semiconductor substrate. A second member is attached to a first surface, which is one surface of the first member. The second member includes a second electronic circuit including another semiconductor element. The second member is provided with a first opening that penetrates the second member in a thickness direction. A first conductor projection is coupled to the first electronic circuit. The first conductor (Continued)

projection protrudes from the first surface of the first member through the first opening of the second member to the outside of the first opening.

20 Claims, 12 Drawing Sheets

(51) Int. Cl.

| | |
|---|---|
| *H01L 25/065* | (2023.01) |
| *H03F 3/195* | (2006.01) |
| *H03F 3/24* | (2006.01) |
| *H10W 44/20* | (2026.01) |
| *H10W 90/00* | (2026.01) |
| *H10W 90/20* | (2026.01) |

(52) U.S. Cl.
CPC .......... *H10W 90/00* (2026.01); *H10W 44/206* (2026.01); *H10W 44/234* (2026.01); *H10W 90/20* (2026.01)

(58) Field of Classification Search
CPC ..... H10W 44/231; H10W 70/60; H03F 1/565; H03F 3/195; H03F 3/245; H03G 11/02
USPC ......................................... 330/307, 302, 310
See application file for complete search history.

(56) References Cited

FOREIGN PATENT DOCUMENTS

| | | | |
|---|---|---|---|
| JP | 2005-109498 | A | 4/2005 |
| JP | 3986575 | B2 | 10/2007 |
| JP | 2008-177241 | A | 7/2008 |
| JP | 2010-535404 | A | 11/2010 |
| JP | 2014-512691 | A | 5/2014 |
| JP | 2019-075536 | A | 5/2019 |
| JP | 2021-002644 | A | 1/2021 |

* cited by examiner

Fig.6A
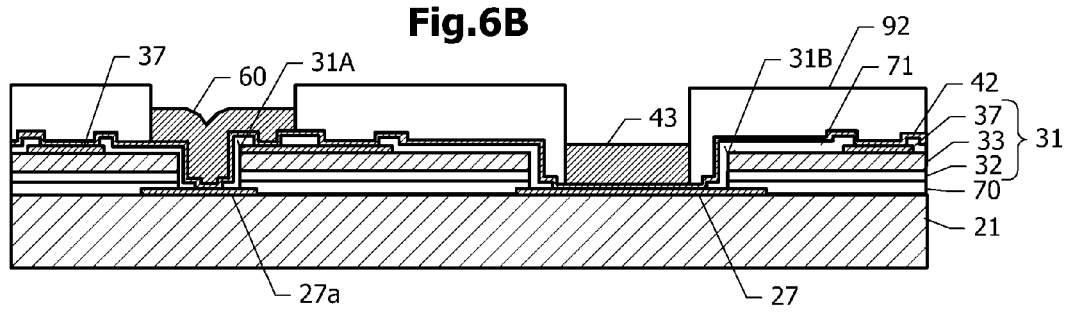
Fig.6B
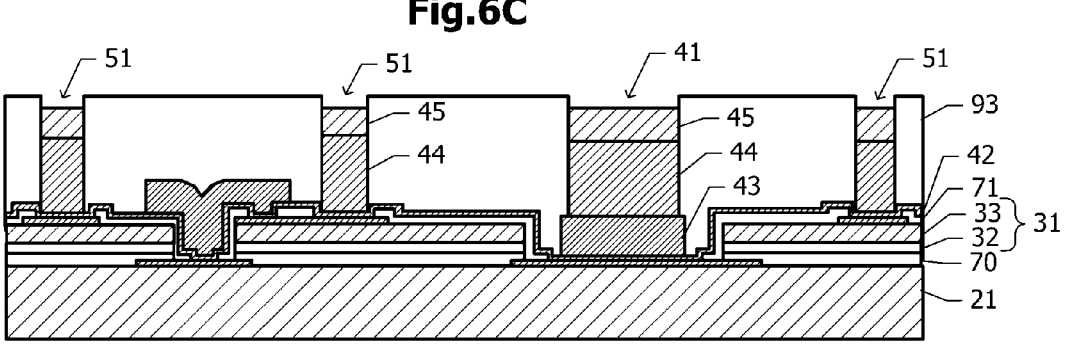
Fig.6C

Fig.12A
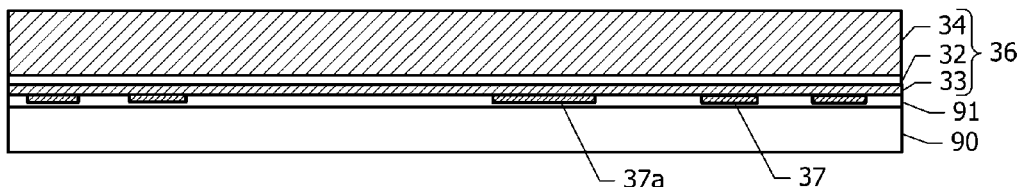
Fig.12B
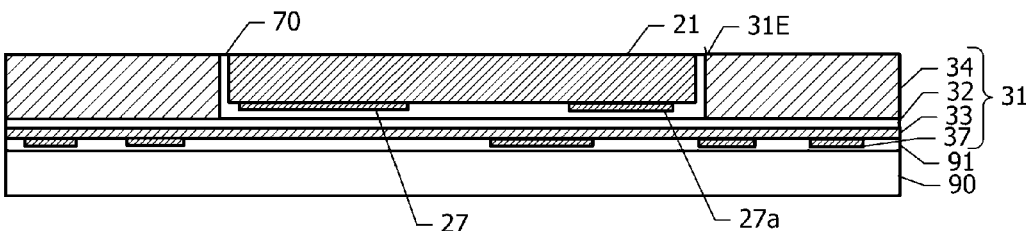
Fig.12C
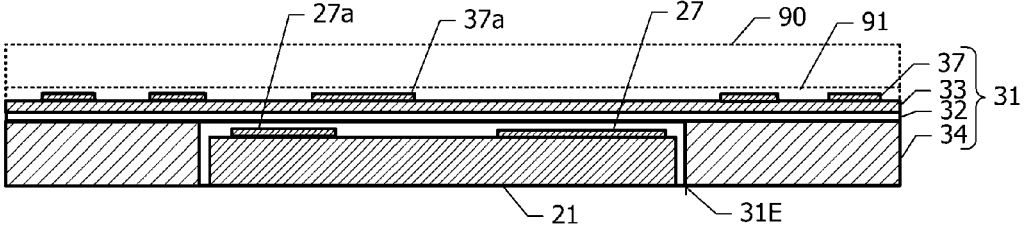
Fig.12D

SEMICONDUCTOR DEVICE

CROSS-REFERENCE TO RELATED APPLICATIONS

This application claims benefit of priority to International Patent Application No. PCT/JP2022/022186, filed May 31, 2022, and to Japanese Patent Application No. 2021-098094, filed Jun. 11, 2021, the entire contents of each are incorporated herein by reference.

BACKGROUND

Technical Field

The present disclosure relates to a semiconductor device.

Background Art

A semiconductor device is known in which a Si die having a control circuit formed thereon is stacked on a GaAs die having a high-frequency power amplifier formed thereon as described, for example, in U.S. Pat. No. 9,583,471. The semiconductor device described in U.S. Pat. No. 9,583,471 is mounted face-up on a module substrate (mounting substrate). Bonding wires are used to couple between terminals on the Si die and terminals on the GaAs die, between the terminals on the Si die and terminals on the module substrate, and between the terminals on the GaAs die and the terminals on the module substrate, respectively. Stacking the Si die on the GaAs die can reduce the area occupied on the mounting surface of the module substrate.

SUMMARY

The semiconductor device described in U.S. Pat. No. 9,583,471 is mounted face-up on the module substrate. A power amplifier transistor, which is a heat source, is disposed on the upper surface of the GaAs die (the surface farther away from the module substrate). This increases thermal resistance of a heat transfer path from the transistor to the module substrate, making it difficult to ensure sufficient heat dissipation.

Accordingly, the present disclosure provides a stacked semiconductor device capable of improving heat dissipation.

According to an aspect of the present disclosure, provided is a semiconductor device, including a first member including a semiconductor substrate and a first electronic circuit; and a second member attached to a first surface that is one surface of the first member. The first electronic circuit includes a semiconductor element provided on one surface of the semiconductor substrate. The second member includes a second electronic circuit including another semiconductor element. The second member is provided with a first opening that penetrates the second member in a thickness direction. The semiconductor device further includes: a first conductor projection that is coupled to the first electronic circuit and protrudes from the first surface of the first member through the first opening of the second member to the outside of the first opening.

The first conductor projection functions as a heat transfer path from the first electronic circuit of the first member to the module substrate. This can increase heat dissipation as compared with a configuration including electrical coupling by wire bonding.

BRIEF DESCRIPTION OF THE DRAWINGS

FIGS. 6A to 6C are each a partial cross-sectional view in each step of a manufacturing process of the semiconductor device according to the first example;

FIGS. 12A to 12D are each a cross-sectional view of the semiconductor device in each step of a manufacturing process.

DETAILED DESCRIPTION

First Example

A semiconductor device according to a first example will be described with reference to FIGS. 1 to 7B.

Figure 1:
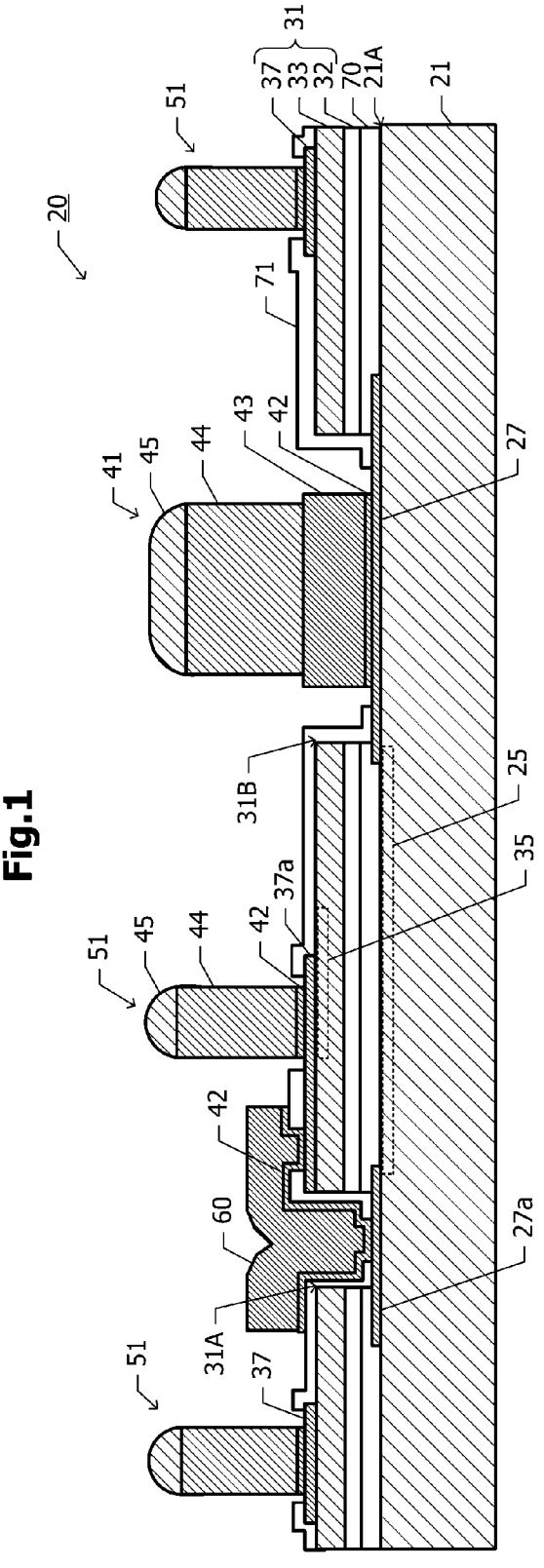
FIG. 1 is a cross-sectional view of a semiconductor device according to a first example.

FIG. 1 is a cross-sectional view of a semiconductor device 20 according to the first example. FIG. 1 does not show a specific cross-sectional structure of the semiconductor device 20 according to the first example, but focuses on positional relationship and electrical coupling between components in a stacking direction.

The semiconductor device 20 according to the first example includes a first member 21 including a semiconductor substrate and a thin-film second member 31. Here, the term "thin film" means that the member is thinner than a wafer, die or the like that can support itself in a manufacturing process, and is so thin that it cannot support itself. The second member 31 is thinner than the first member 21. The first member 21 includes the semiconductor substrate, a first electronic circuit 25 provided on one surface of the semiconductor substrate, and a plurality of pads 27 disposed on the one surface of the semiconductor substrate. The surface of the first member 21 on which the first electronic circuit 25 is disposed will be referred to as a first surface 21A. A compound semiconductor substrate made of GaAs and the like, for example, is used as the semiconductor substrate. The first electronic circuit 25 is a high-frequency power amplifier including a compound semiconductor-based semiconductor element, a multilayer wiring layer, and the like. The semiconductor element is, for example, a heterojunction bipolar transistor (HBT), including a semiconductor layer and the like epitaxially grown on the compound semiconductor substrate.

In FIG. 1, a region where the first electronic circuit 25 is disposed is indicated by a dashed line. However, the region indicated by the dashed line indicates a rough position in a thickness direction of the first member 21, and does not indicate a position in a plan view. The position of the first electronic circuit 25 in a plan view will be described later with reference to FIG. 4. A circuit configuration of the first electronic circuit 25 will be described later with reference to FIG. 3.

The second member 31 includes an insulating layer 32, a semiconductor layer 33, and a plurality of pads 37. The insulating layer 32 is attached to the first surface 21A of the first member 21 with an adhesive layer 70 interposed therebetween. The semiconductor layer 33 is stacked on the insulating layer 32. The plurality of pads 37 are disposed on an upper surface of the semiconductor layer 33 (the surface facing the same direction as the first surface 21A). As an example, the semiconductor layer 33 is made of silicon and the insulating layer 32 is made of silicon oxide. A second electronic circuit 35 is provided in the semiconductor layer 33. The second electronic circuit 35 is a control circuit for the first electronic circuit 25, and includes a silicon-based semiconductor element such as a MOS transistor (MOS-FET) and a multilayer wiring layer. The semiconductor element of the second electronic circuit 35 includes impurity diffusion regions and the like formed in the surface part of the semiconductor layer 33.

The second member 31 has an inter-member connection opening 31A and a first opening 31B provided therein, which penetrate the second member 31 in its thickness direction. The inter-member connection opening 31A overlaps a first pad 27*a*, which is one of the plurality of pads 27, in a plan view. More specifically, the inter-member connection opening 31A is included in the first pad 27*a* in a plan view. The first opening 31B is included in at least one pad 27 other than the first pad 27*a* in a plan view, and extends from the upper surface of the semiconductor layer 33 to the pad 27. An insulating film 71 covers the surface of the second member 31, side and bottom surfaces of the inter-member connection opening 31A, and side and bottom surfaces of the first opening 31B. The insulating film 71 is made of silicon oxide, for example. A plurality of openings are provided in the insulating film 71 to expose the plurality of pads 27 and 37, respectively.

An inter-member connection wire 60 made of a metal film such as a Cu film is disposed on the insulating film 71. The inter-member connection wire 60 is coupled to the first pad 27*a* through the inter-member connection opening 31A and the opening provided in the insulating film 71. The inter-member connection wire 60 is also coupled to a second pad 37*a*, which is one of the plurality of pads 37, through the other opening provided in the insulating film 71. A seed layer 42 made of Cu is disposed under the inter-member connection wire 60.

At least one of the openings provided in the insulating film 71 is disposed at a position that is included in the first opening 31B in a plan view. A base 43 made of a metal film such as a Cu film is disposed on the pad 27 exposed at the bottom surface of the first opening 31B. The base 43 has its upper surface located at substantially the same height as the upper surface of the pad 37 of the second member 31 with the first surface 21A as a height reference. The seed layer 42 is disposed between the base 43 and the pad 27.

A pillar 44 and a solder layer 45 are disposed on the base 43. The seed layer 42, base 43, pillar 44, and solder layer 45 constitute a first conductor projection 41. The pillar 44 is included in the base 43 in a plan view. The first conductor projection 41 is coupled to the first electronic circuit 25 via the pad 27. The first conductor projection 41 also protrudes from the upper surface of the pad 27 to the outside of the first opening 31B through the first opening 31B. In other words, the first conductor projection 41 protrudes to a position higher than the upper surface of the insulating film 71 through the first opening 31B. The pillar 44 is made of Cu, for example.

A second conductor projection 51 including the seed layer 42, pillar 44 made of Cu, and solder layer 45 is disposed on each of the pads 37 exposed in the plurality of openings provided in the insulating film 71. The first and second conductor projections 41 and 51 having such a structure are called Cu pillar bumps. An under-bump metal layer may be disposed on the bottom surface of the seed layer 42 for the purpose of improving close contact. An Au bump, a solder ball bump, a conductor post (also referred to as a post), and the like may also be used, instead of the pillar 44 and the solder layer 45. When conductor posts are used, the conductor post is set on the base 43 in the first conductor projection 41, and the conductor post is set on the pad 37 in the second conductor projection 51.

Figure 2:
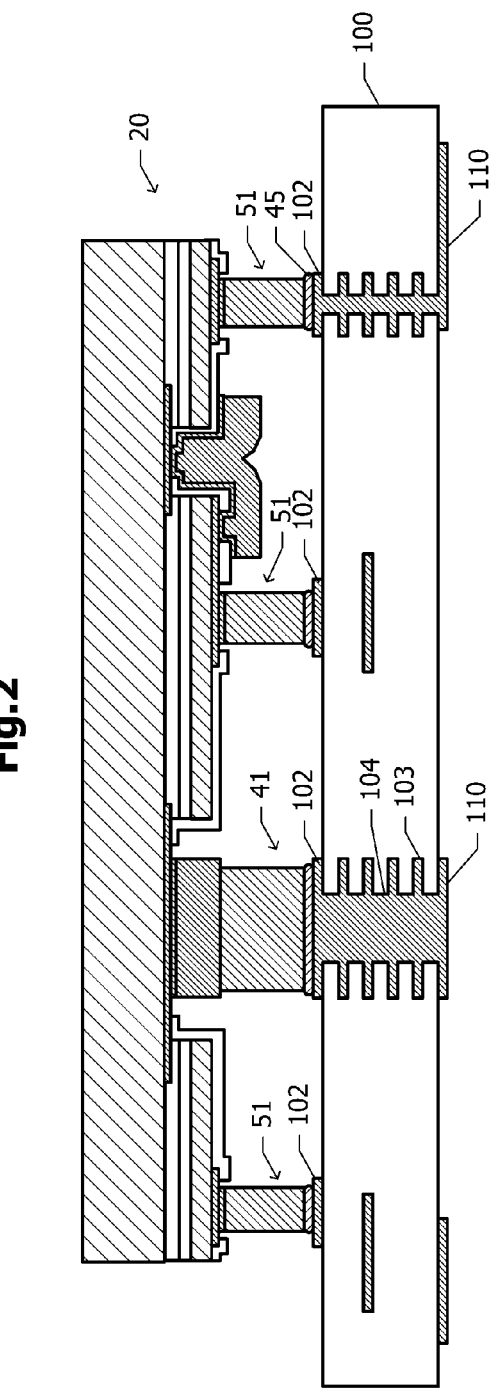
FIG. 2 is a cross-sectional view of a power amplifier module mounted with the semiconductor device according to the first example.

FIG. 2 is a cross-sectional view of a power amplifier module mounted with the semiconductor device 20 according to the first example. The power amplifier module includes the semiconductor device 20 according to the first example and a module substrate 100 having the semiconductor device 20 mounted face down thereon. A plurality of lands 102 are disposed on a mounting surface of the module substrate 100. The solder layers 45 (FIG. 1) of the first conductor projections 41 and the second conductor projections 51 in the semiconductor device 20 are coupled to the lands 102, respectively.

A plurality of backside conductor films 110 are disposed on the back surface of the module substrate 100 opposite to the mounting surface. Some of the lands 102 are coupled to the backside conductor films 110 via a plurality of inner conductor films 103 and a plurality of vias 104.

Figure 3:
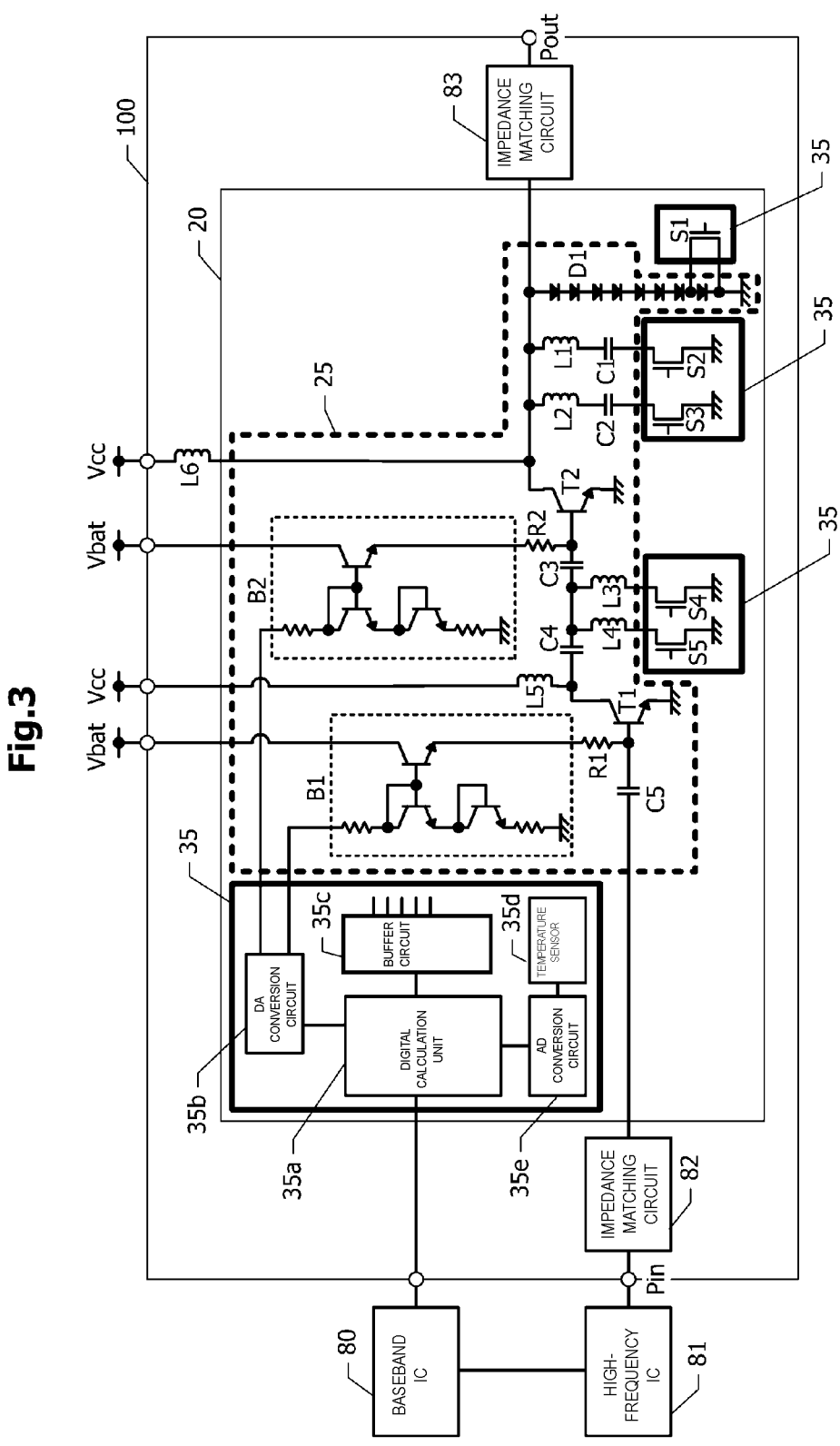
FIG. 3 is an equivalent circuit diagram and a block diagram of the power amplifier module mounted with the semiconductor device according to the first example.

FIG. 3 is an equivalent circuit diagram and a block diagram of the power amplifier module mounted with the semiconductor device 20 according to the first example. A baseband integrated circuit 80, a high-frequency integrated circuit 81, a power source Vcc, and a bias power source Vbat are coupled to the power amplifier module.

The high-frequency integrated circuit 81 generates a high-frequency signal Pin by modulating a baseband signal inputted from the baseband integrated circuit 80. The high-frequency signal Pin generated by the high-frequency integrated circuit 81 is inputted to the power amplifier module. The baseband integrated circuit 80 outputs various control information to the power amplifier module. The power amplifier module amplifies the high-frequency signal Pin based on the control information from the baseband integrated circuit 80 and outputs a high-frequency signal Pout thus amplified. The high-frequency integrated circuit 81 selects one frequency band from among a plurality of frequency bands, based on a control signal inputted from the baseband integrated circuit 80, and generates a high-frequency signal Pin of the selected frequency band.

On the module substrate 100, the semiconductor device 20, an input-side impedance matching circuit 82, an output-side impedance matching circuit 83, and a choke coil L6 are mounted. The semiconductor device 20 includes the first electronic circuit 25 and the second electronic circuit 35.

The first electronic circuit 25 is a two-stage high-frequency power amplifier, and includes a driver-stage transistor T1 and an output-stage transistor T2. The driver-stage transistor T1 includes a plurality of transistor cells coupled in parallel with each other. Similarly, the output-stage transistor T2 also includes a plurality of transistor cells coupled in parallel with each other. The first electronic circuit 25 further includes passive elements such as capacitors C1, C2, C3, C4, and C5, inductors L1, L2, L3, L4, and L5, ballast resistor elements R1 and R2, and a plurality of diodes D1 coupled in multiple stages. The inductor L2 and the capacitor C2 are coupled in series. The inductor L1 and the capacitor C1 are coupled in series.

The inductors L3 and L4 have different inductances. A series circuit of the inductor L1 and the capacitor C1 and a series circuit of the inductor L2 and the capacitor C2 have different reactances.

The driver-stage transistor T1 has its base coupled to a first bias circuit B1 through the ballast resistor element R1. The ballast resistor element R1 is provided for each of the plurality of transistor cells included in the driver-stage transistor T1. The output-stage transistor T2 has its base coupled to a second bias circuit B2 through the ballast resistor element R2. The ballast resistor element R2 is provided for each of the plurality of transistor cells included in the output-stage transistor T2. The first bias circuit B1 and the second bias circuit B2 are coupled to the bias power source Vbat.

The driver-stage transistor T1 and output-stage transistor T2 have their emitters grounded. The driver-stage transistor T1 has its collector coupled to the power source Vcc through the inductor L5. The output-stage transistor T2 has its collector coupled to the power source Vcc through the choke coil L6 mounted on the module substrate 100.

The high-frequency signal Pin outputted from the high-frequency integrated circuit 81 is inputted to the base of the driver-stage transistor T1 through the input-side impedance matching circuit 82 and the capacitor C5. The capacitor C5 is provided for each of the transistor cells included in the driver-stage transistor T1.

The driver-stage transistor T1 has its collector coupled to the base of the output-stage transistor T2 through an inter-stage impedance matching circuit and the capacitor C3. The capacitor C3 is provided for each of the transistor cells included in the output-stage transistor T2. The interstage impedance matching circuit includes the capacitor C4 and the inductors L3 and L4. The capacitor C5 is coupled in series between the collector of the driver-stage transistor T1 and the capacitor C5.

The inductors L4 and L3 are shunt-coupled between capacitors C4 and C3, respectively, and grounded through MOS transistors S4 and S5 (switching transistors) in the second electronic circuit 35. That is, a series connection circuit including the inductor L4 and the MOS transistor S5 and a series connection circuit including the inductor L3 and the MOS transistor S4 are coupled in parallel. The inter-member connection wire 60 (FIG. 1) couples between the inductor L3 and the MOS transistor S4 and between the inductor L4 and the MOS transistor S5. Switching on and off of the MOS transistors S4 and S5 can optimize impedance matching according to the frequency band of the high-frequency signal Pin.

The output-stage transistor T2 has its collector coupled to the output-side impedance matching circuit 83 mounted on the module substrate 100. The high-frequency signal amplified by the output-stage transistor T2 is outputted to the outside as the high-frequency signal Pout through the impedance matching circuit 83.

The collector of the output-stage transistor T2 is further grounded through two harmonic wave termination circuits.

One of the harmonic wave termination circuits includes the inductor L2, the capacitor C2, and a MOS transistor S3 (switching transistor) in the second electronic circuit 35, which are coupled in series. The other harmonic wave termination circuit includes the inductor L1, the capacitor C1, and a MOS transistor S2 (switching transistor) in the second electronic circuit 35, which are coupled in series.

The inter-member connection wire 60 (FIG. 1) couples between the capacitor C1 and the MOS transistor S2 and between the capacitor C2 and the MOS transistor S3. Switching on and off of the MOS transistors S2 and S3 can optimize the harmonic wave termination circuit according to the frequency band of the high-frequency signal Pin.

The collector of the output-stage transistor T2 is further grounded through a protection circuit including the plurality of diodes D1 coupled in multiple stages. The plurality of diodes D1 coupled in multiple stages are coupled so that the direction from the collector of the output-stage transistor T2 to the ground is a forward direction. A MOS transistor S1 (switching transistor) in the second electronic circuit 35 is coupled in parallel to some of the diodes D1 included in the protection circuit, for example, one diode D1. The inter-member connection wire 60 (FIG. 1) couples between the diode D1 and the MOS transistor S1. Switching on and off of the MOS transistor S1 can switch the effective number of stages of the diodes D1 included in the protection circuit.

The second electronic circuit 35 includes, in addition to the MOS transistors Si, S2, S3, S4, and S5, a digital calculation unit 35a, a DA conversion circuit 35b, a buffer circuit 35c, a temperature sensor 35d, and an AD conversion circuit 35e.

The digital calculation unit 35a is coupled to the baseband integrated circuit 80 outside the power amplifier module. The DA conversion circuit 35b converts a command signal from the digital calculation unit 35a into an analog signal, and supplies a bias control signal to the first bias circuit B1 and the second bias circuit B2. The inter-member connection wire 60 (FIG. 1) couples between the DA conversion circuit 35b and the first bias circuit B1 and between the DA conversion circuit 35b and the second bias circuit B2. The first bias circuit B1 and the second bias circuit B2 supply base biases to the driver-stage transistor T1 and the output-stage transistor T2, respectively, according to the bias control signal.

The temperature sensor 35d measures an ambient temperature. The AD conversion circuit 35e converts the measured value from the temperature sensor 35d into a digital signal. A digital signal corresponding to the measured value of the temperature of the output-stage transistor T2 is inputted to the digital calculation unit 35a.

The digital calculation unit 35a controls on and off of the MOS transistors Si, S2, S3, S4, and S5 via the buffer circuit 35c. The operation of the digital calculation unit 35a will be described below.

The digital calculation unit 35a turns on one of the MOS transistors S4 and S5 coupled to the interstage impedance matching circuit and one of the MOS transistors S2 and S3 coupled to the harmonic wave termination circuit according to the frequency band of the high-frequency signal Pin inputted to the power amplifier module. This optimizes interstage impedance matching and reduces harmonic waves contained in the outputted high-frequency signal Pout.

The digital calculation unit 35a also controls on and off of the MOS transistor S1 according to the ambient temperature measured by the temperature sensor 35d. Generally, as the ambient temperature drops, a breakdown voltage of the output-stage transistor T2 drops and a forward voltage of the diode D1 increases. This deteriorates the protection function of the protection circuit. The MOS transistor S1 is turned on when the ambient temperature becomes lower than or equal to a predetermined determination threshold. This reduces the effective number of diodes D1 included in the protection circuit, thus preventing deterioration in protection function of the protection circuit.

The digital calculation unit 35a controls the first bias circuit B1 and the second bias circuit B2 according to the frequency band of the high-frequency signal Pin and the ambient temperature measured by the temperature sensor 35d. Thus, a suitable base bias is supplied according to the frequency band of the high-frequency signal Pin and the ambient temperature.

Figure 4:
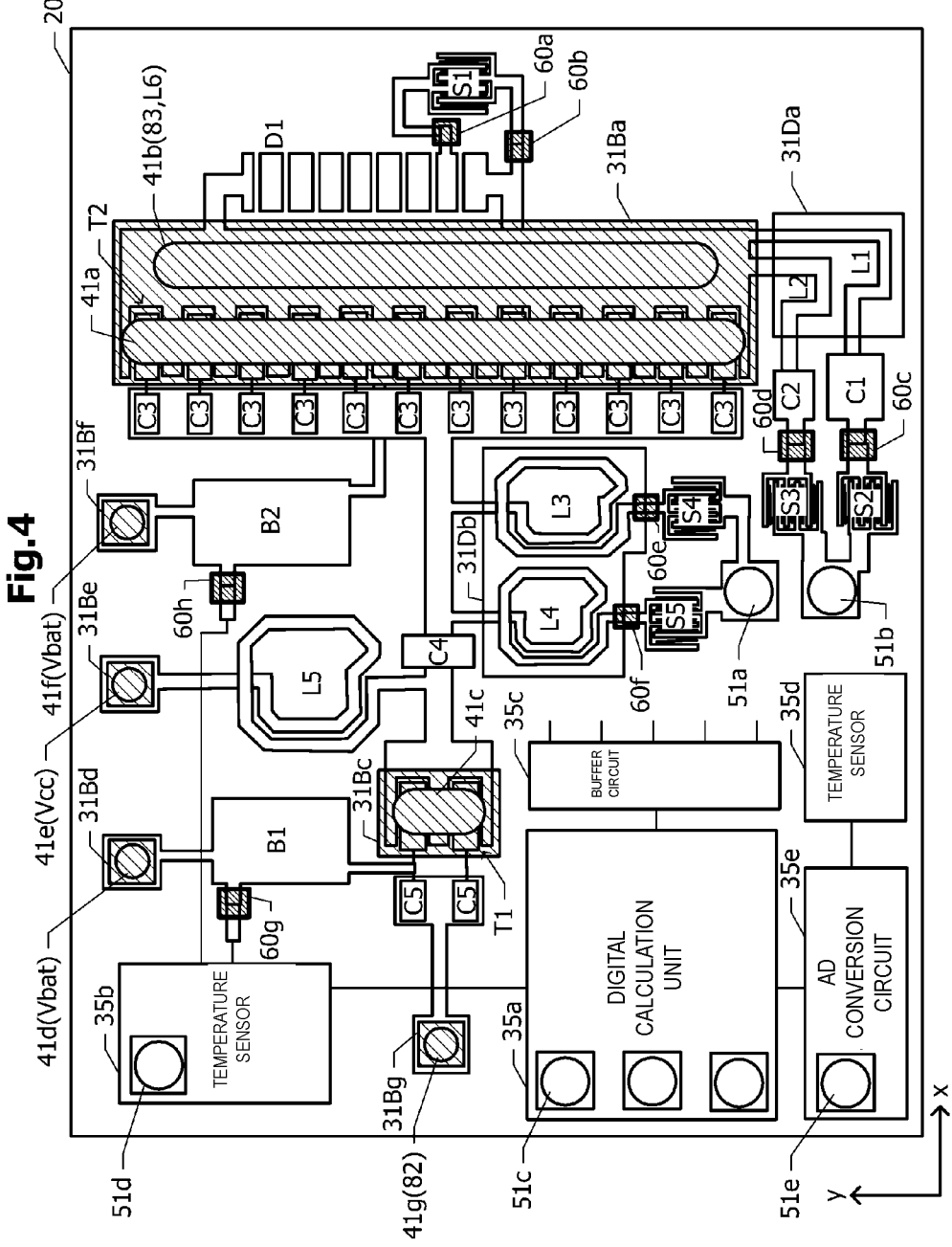
FIG. 4 is a diagram illustrating a planar positional relationship between respective constituent elements of the semiconductor device according to the first example.

FIG. 4 is a diagram illustrating a planar positional relationship between the respective constituent elements in the semiconductor device 20 according to the first example. In FIG. 4, relatively dense hatching denotes a plurality of inter-member connection wires 60 (FIG. 1) coupling the first electronic circuit 25 and the second electronic circuit 35, while light hatching denotes a plurality of first openings 31B (FIG. 1) provided in the second member 31.

In FIG. 4, the plurality of inter-member connection wires 60 are denoted by reference numerals 60a to 60h to differentiate between the inter-member connection wires 60. The plurality of first openings 31B are denoted by reference numerals 31Ba, 31Bc to 31Bg to differentiate between the plurality of first openings 31B. The plurality of first conductor projections 41 are denoted by reference numerals 41a to 41g to differentiate between the plurality of first conductor projections 41. The plurality of second conductor projections 51 are denoted by reference numerals 51a to 51e to differentiate between the plurality of second conductor projections 51. The shape of the semiconductor device 20 in a plan view is rectangular or square. An xy orthogonal coordinate system is defined in which directions parallel to the edges of the semiconductor device 20 are an x-direction and a y-direction.

The first conductor projection 41g coupled to the impedance matching circuit 82 (FIG. 3) is disposed near the edge of the semiconductor device 20 on the negative side of the x-axis (left edge in FIG. 4). Two capacitors C5, the driver-stage transistor T1, the capacitor C4, a plurality of capacitors C3, the output-stage transistor T2, the plurality of diodes D1, and the MOS transistor Si are disposed toward the positive side of the x-axis from the first conductor projection 41g.

The first conductor projection 41g is coupled to the input-side impedance matching circuit 82 mounted on the module substrate 100 (FIG. 3). In a plan view, the first conductor projection 41g is disposed inside the first opening 31Bg provided in the second member 31.

The driver-stage transistor T1 includes two transistor cells disposed in the y-direction. The two capacitors C5 are lined up in the y-direction corresponding to the two transistor cells in the driver-stage transistor T1. The first conductor projection 41c long in the y-direction is disposed so as to overlap the two transistor cells included in the driver-stage transistor T1. The first conductor projection 41c is coupled to the emitter of the driver-stage transistor T1, and is disposed in the first opening 31Bc provided in the second member 31 (FIG. 1) in a plan view.

The output-stage transistor T2 includes a plurality of transistor cells lined up in the y-direction. A plurality of capacitors C3 are lined up in the y-direction corresponding to the plurality of transistor cells included in the output-stage transistor T2. The first conductor projection 41a long in the y-direction is disposed so as to overlap the plurality of transistor cells included in the output-stage transistor T2. The first conductor projection 41a is coupled to the emitter of the output-stage transistor T2, and is disposed in the first opening 31Ba provided in the second member 31 in a plan view.

Another first conductor projection 41b long in the y-direction is disposed inside the first opening 31Ba. The first conductor projection 41b is coupled to the collector of the output-stage transistor T2. The first conductor projection 41b is coupled to the output-side impedance matching circuit 83 and the choke coil L6 mounted on the module substrate 100 (FIG. 3).

The plurality of diodes D1 included in the protection circuit are lined up in the y-direction on the positive side of the x-axis with respect to the first opening 31Ba. The MOS transistor S1 is disposed in the vicinity of one diode D1. The MOS transistor S1 and the one diode D1 are coupled in parallel by the inter-member connection wires 60a and 60b.

The DA conversion circuit 35b provided in the second member 31 is disposed on the positive side in the y-direction with respect to the first conductor projection 41g. A second conductor projection 51d coupled to the DA conversion circuit 35b is disposed in the second member 31 (FIG. 1). The first bias circuit B1 is disposed on the positive side in the y-direction with respect to the driver-stage transistor T1. The inductor L5 is disposed on the positive side in the y-direction with respect to the capacitor C4. The second bias circuit B2 is disposed on the positive side in the y-direction with respect to the wiring coupling the capacitor C4 and the plurality of capacitors C3. The first bias circuit B1 and the second bias circuit B2 are coupled to the DA conversion circuit 35b through the inter-member connection wires 60g and 60h, respectively.

The first conductor projections 41d, 41e, and 41f are disposed on the positive side in the y-direction with respect to the first bias circuit B1, the inductor L5, and the second bias circuit B2, respectively. The first conductor projections 41d, 41e, and 41f are coupled to the first bias circuit B1, the inductor L5, and the second bias circuit B2, respectively. The first conductor projections 41d, 41e, and 41f are disposed inside the first openings 31Bd, 31Be, and 31Bf, respectively. With the semiconductor device 20 mounted on the module substrate 100 (FIGS. 2 and 3), the first conductor projections 41d, 41e, and 41f are coupled to the bias power source Vbat, the power source Vcc, and the bias power source Vbat, respectively.

The digital calculation unit 35a and the AD conversion circuit 35e provided in the second member 31 are lined up in the y-direction on the negative side in the y-direction with respect to the first conductor projection 41g. In the second member 31 (FIG. 1), a plurality of second conductor projections 51c coupled to the digital calculation unit 35a and the second conductor projection 51e coupled to the AD conversion circuit 35e are disposed. The buffer circuit 35c and the temperature sensor 35d provided in the second member 31 are lined up in the y-direction on the negative side in the y-direction with respect to the driver-stage transistor T1.

The spiral inductors L4 and L3 are lined up in the x-direction on the negative side in the y-direction with respect to the wiring coupling the capacitor C4 and the plurality of capacitors C3. An opening 31Db is provided in the semiconductor layer 33 (FIG. 1) of the second member 31 so as to include the inductors L4 and L3 in a plan view.

The MOS transistors S5 and S4 provided in the second member 31 are disposed near the negative side in the y-direction with respect to the inductors L4 and L3, respectively. The MOS transistors S5 and S4 have their drains coupled to the inductors L4 and L3 through the inter-member connection wires 60*f* and 60*e*, respectively. The second conductor projection 51*a* coupled to sources of the MOS transistors S5 and S4 is disposed on the negative side in the y-direction with respect to the MOS transistor S5. With the semiconductor device 20 mounted on the module substrate 100 (FIGS. 2 and 3), the second conductor projection 51*a* is coupled to the ground of the module substrate 100.

The meandering inductors L2 and L1 are lined up in the y-direction on the negative side in the y-direction with respect to the first opening 31Ba. An opening 31Da is provided in the semiconductor layer 33 (FIG. 1) of the second member 31 so as to include the inductors L2 and L1 in a plan view.

The capacitors C2 and C1 are disposed on the negative side in the x-direction with respect to inductors L2 and L1, respectively. The MOS transistors S3 and S2 provided in the second member 31 (FIG. 1) are disposed near the negative side in the x-direction with respect to the capacitors C2 and C1, respectively. The MOS transistors S3 and S2 have their drains coupled to the capacitors C2 and C1 through the inter-member connection wires 60*d* and 60*c*, respectively.

The second conductor projection 51*b* coupled to sources of the MOS transistors S3 and S2 is disposed on the negative side in the x-direction with respect to the MOS transistors S3 and S2. With the semiconductor device 20 mounted on the module substrate 100 (FIGS. 2 and 3), the second conductor projection 51*b* is coupled to the ground of the module substrate 100.

Next, a method for manufacturing a semiconductor device according to the first example will be described with reference to FIGS. 5A to 7B. FIGS. 5A to 7B are each a cross-sectional view in each step of a manufacturing process of a semiconductor device according to the first example.

Figure 5A:
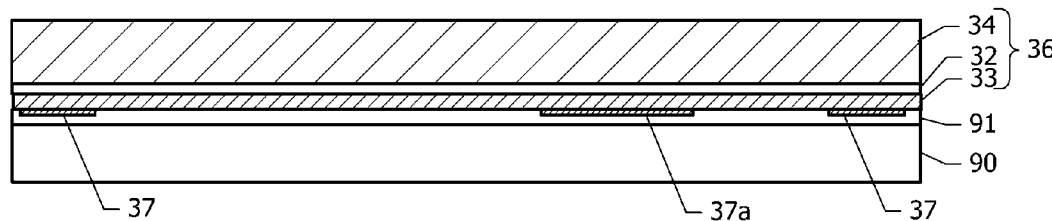
FIGS. 5A to 5D are each a partial cross-sectional view in each step of a manufacturing process of the semiconductor device according to the first example.

As illustrated in FIG. 5A, an SOI wafer 36 including a support substrate 34, an insulating layer 32, and a semiconductor layer 33 is prepared. At this stage, the SOI wafer 36 is not isolated into multiple chips. A second electronic circuit 35 (FIGS. 1 and 3) is formed on the semiconductor layer 33 of the SOI wafer 36 by a known semiconductor process. A plurality of pads 37 are formed on the surface of the semiconductor layer 33. The plurality of pads 37 include a second pad 37*a*.

The SOI wafer 36 is bonded to a temporary substrate 90 by an adhesive layer 91 with the semiconductor layer 33 facing the temporary substrate 90. A glass substrate can be used, for example, as the temporary substrate 90.

Figure 5B:
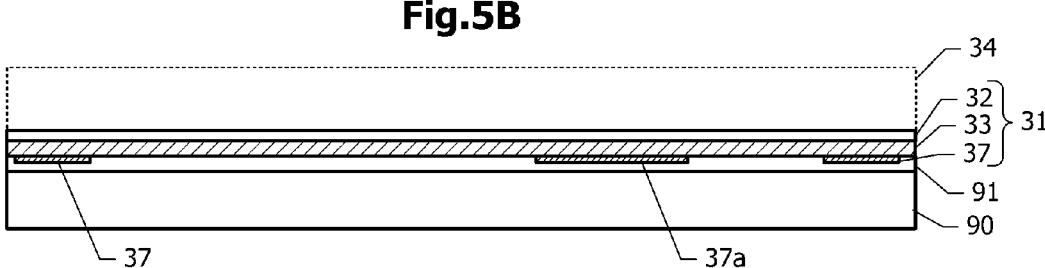

As illustrated in FIG. 5B, the support substrate 34 (FIG. 5A) is removed by etching. The removed support substrate 34 is indicated by the dashed line in FIG. 5B. The insulating layer 32, the semiconductor layer 33, and the plurality of pads 37 constitute a second member 31 (FIG. 1).

Figure 5C:
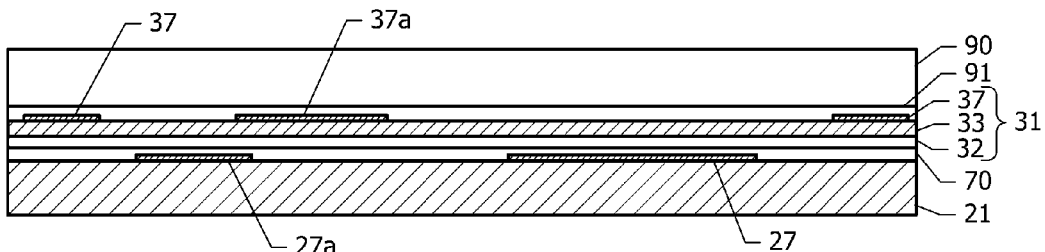

As illustrated in FIG. 5C, a first member 21 is prepared by forming a first electronic circuit 25 (FIGS. 1 and 3) and a plurality of pads 27 including a first pad 27*a* on a substrate made of a compound semiconductor such as GaAs. The second member 31 and the first member 21 are aligned so that the insulating layer 32 of the second member 31 and a circuit forming surface of the first member 21 face each other, and the both members are bonded by an adhesive layer 70. In this event, the first pad 27*a* of the first member 21 and the second pad 37*a* of the second member 31 partially overlap in a plan view.

Figure 5D:
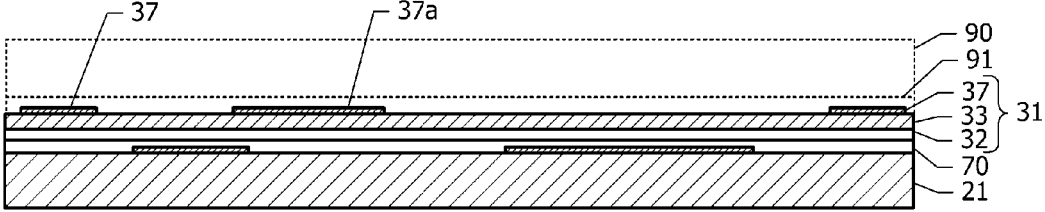

As illustrated in FIG. 5D, the temporary substrate 90 and the adhesive layer 91 are removed by etching. The removed temporary substrate 90 and adhesive layer 91 are indicated by the dashed line in FIG. 5D.

As illustrated in FIG. 6A, a plurality of inter-member connection openings 31A and a plurality of first openings 31B are formed in the semiconductor layer 33, the insulating layer 32, and the adhesive layer 70. FIG. 6A illustrates one inter-member connection opening 31A and one first opening 31B. A partial surface region of the first pad 27*a* is exposed on the bottom surface of each of the plurality of inter-member connection openings 31A. A partial surface region of the pad 27 is exposed on the bottom surface of each of the plurality of first openings 31B. In this event, although not illustrated in FIG. 6A, openings 31Da and 31Db (FIG. 4) are formed in the semiconductor layer 33. The insulating layer 32 is exposed at the bottom surfaces of the openings 31Da and 31Db (FIG. 4).

An insulating film 71 made of silicon oxide is deposited on the surface of the semiconductor layer 33, the surface of the pad 37, the side and bottom surfaces of the inter-member connection opening 31A, and the side and bottom surfaces of the first opening 31B. A plurality of openings are then formed at predetermined positions of the insulating film 71. Partial surface regions of the pad 27, first pad 27*a*, pad 37, and second pad 37*a* are exposed at the bottom surfaces of these openings.

As illustrated in FIG. 6B, a seed layer 42 is deposited on the surface of the insulating film 71 and the bottom surface of the opening formed in the insulating film 71. A photo-sensitive plating resist film 92 is formed on the seed layer 42. A plurality of openings are formed by exposing and developing predetermined regions of the plating resist film 92. Specifically, openings are formed in regions to form a base 43 and an inter-member connection wire 60. The seed layer 42 is exposed at the bottom of the opening.

By plating Cu on the seed layer 42 exposed at the bottom of the opening formed in the plating resist film 92, the base 43 and the inter-member connection wire 60 are formed. In this event, the height of the base 43 is adjusted so that the upper surface of the base 43 and the upper surface of the pad 37 are substantially at the same height. The plating resist film 92 is removed after the plating.

As illustrated in FIG. 6C, a photosensitive plating resist film 93 is formed on the entire surface. A plurality of openings are formed by exposing and developing predetermined regions of the plating resist film 93. Specifically, openings are formed in regions to form a first conductor projection 41 and a second conductor projection 51 (FIGS. 1 and 4). The base 43 is exposed at the bottom of the opening in the region to form the first conductor projection 41. The seed layer 42 is exposed at the bottom of the region to form the second conductor projection 51.

By plating Cu inside the plurality of openings in the plating resist film 93, pillars 44 are formed. A solder layer 45 is formed by plating solder on the pillars 44.

Figure 7A:
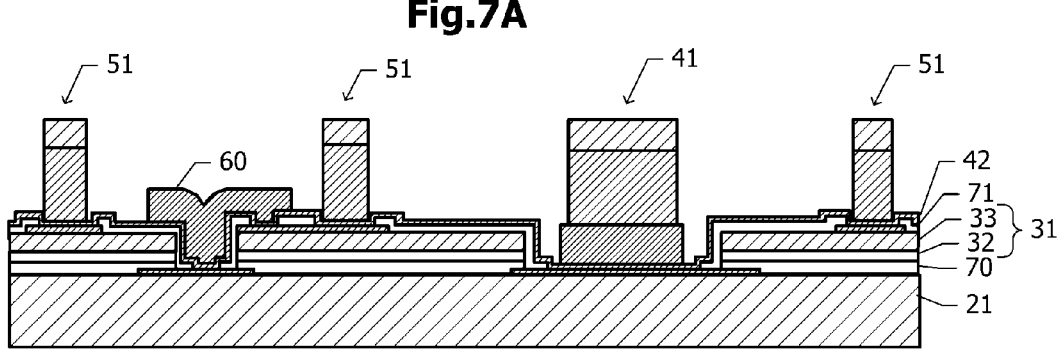
FIGS. 7A and 7B are partial cross-sectional views of the semiconductor device according to the first example in the middle of manufacturing process.

As illustrated in FIG. 7A, the plating resist film 93 is removed. This partially exposes the seed layer 42.

Figure 7B:
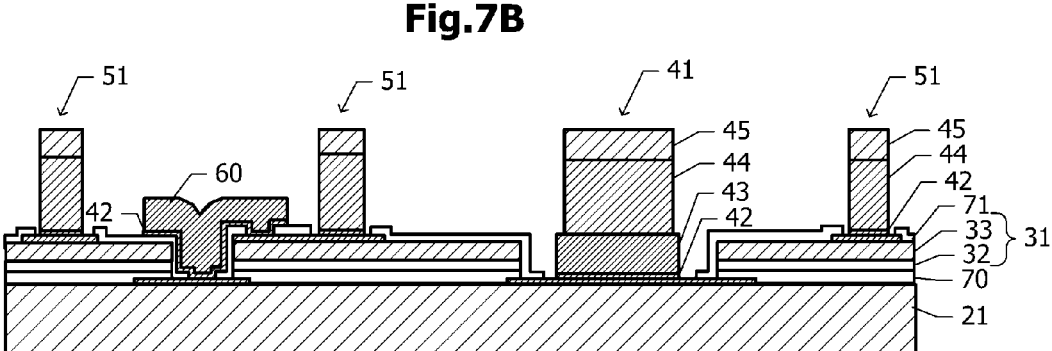

As illustrated in FIG. 7B, the exposed seed layer 42 is removed. The first conductor projection 41 including the seed layer 42, base 43, pillars 44, and solder layer 45 is thus formed. The second conductor projection 51 including the seed layer 42, pillars 44, and solder layer 45 is thus formed. The seed layer 42 remains under the inter-member connection wire 60. The solder layer 45 is reflow-processed. After the reflow process, the wafer is divided into chips by dicing.

Next, advantageous effects of the first example will be described.

In the first example, the first conductor projection 41 (FIG. 1) protrudes from the first surface 21A of the first member 21 where the first electronic circuit 25 is formed and is coupled to the module substrate 100. The output-stage transistor T2 in the first electronic circuit 25 becomes a heat source during amplification operation of the semiconductor device 20. The first conductor projection 41 functions as a heat transfer path from the heat source of the first electronic circuit 25 to the module substrate 100.

In the configuration in which the semiconductor device is mounted face up, the compound semiconductor substrate of the first member 21 serves as a heat transfer path from the heat source of the first electronic circuit 25 to the module substrate. In the first example, the first conductor projection 41 that functions as the heat transfer path has a thermal conductivity higher than that of the compound semiconductor substrate. This can increase the heat dissipation from the heat source of the first electronic circuit 25.

In the first example, the first conductor projection 41 includes the base 43 (FIG. 1) and the second conductor projection 51 does not include a portion corresponding to the base 43. With the first surface 21A of the first member 21 as the height reference, the top surface of the base 43 and the top surface of the pad 37 of the second member 31 are substantially at the same height. Therefore, the height to the top of the first conductor projection 41 and the height to the top of the second conductor projection 51 become substantially the same. This can facilitate face-down mounting on the module substrate 100 (FIG. 2).

Next, a preferable thickness of the base 43 will be described. The thickness of the base 43 may be set such that the difference in height between the top of the first conductor projection 41 and the top of the second conductor projection 51 is smaller than the sum of the thickness of the second member 31 and the thickness of the adhesive layer 70. This can achieve the effect of providing the base 43. In other words, the thickness of the base 43 is preferably less than twice the sum of the thicknesses of the second member 31 and the adhesive layer 70. It is more preferable that the difference between the height from the first surface 21A to the top of the first conductor projection 41 and the height to the top of the second conductor projection 51 is a difference that can be absorbed by the solder layer 45 during mounting.

In the first example, the first electronic circuit 25 in the first member 21 and the second electronic circuit 35 in the second member 31 are coupled by the inter-member connection wire 60 without using a bonding wire. In some cases, the elements included in the first electronic circuit 25 and the elements included in the second electronic circuit 35 are disposed near or adjacent to each other in a plan view and are coupled by the inter-member connection wire 60. This can reduce a parasitic inductance of a current path coupling both, compared to a configuration using bonding wires.

For example, the parasitic inductance of the wire coupling the DA conversion circuit 35b and the first bias circuit B1 and the wire coupling the DA conversion circuit 35b and the second bias circuit B2 illustrated in FIG. 3 is reduced. This can reduce bias control operation delay. The parasitic inductance of the wire coupling the capacitor C1 and the MOS transistor S2 and the wire coupling the capacitor C2 and the MOS transistor S3 is also reduced. This makes it easier to set the impedance value of the harmonic wave termination circuit to a desired value.

The parasitic impedance of the wire coupling the inductor L3 and the MOS transistor S4 and the wire coupling the inductor L4 and the MOS transistor S5 is reduced. This makes it easier to set the impedance value of the interstage impedance matching circuit to a desired value.

The parasitic inductance of the wire coupling the diode D1 and the MOS transistor Si in parallel is reduced. This can make it possible to reduce the parasitic inductance of the protection circuit when the MOS transistor S1 is turned on. This can prevent the operation delay of the protection circuit.

In the first example, as illustrated in FIG. 4, the opening 31Da provided in the semiconductor layer 33 of the second member 31 is disposed in the region where the inductors L1 and L2 are disposed. The opening 31Db provided in the semiconductor layer 33 of the second member 31 is disposed in the region where the inductors L3 and L4 are disposed. When a low-insulation semiconductor layer is disposed in a region that overlaps the inductor in a plan view, the loss of the inductor increases. In the first example, the openings 31Da and 31Db prevent the inductors L1, L2, L3, and L4 from overlapping the semiconductor layer 33 (FIG. 1) in a plan view. This makes it possible to prevent an increase in loss of the inductors L1, L2, L3, and L4.

When the semiconductor layer 33 is sufficiently thin that the loss of the inductors L1, L2, L3, and L4 does not pose a problem, the openings 31Da and 31Db do not need to be provided. When the loss of the inductor L5 becomes a problem, on the other hand, the semiconductor layer 33 in the region where the inductor L5 is disposed may be removed.

Next, a modification of the first example will be described.

In the first example, the interstage impedance matching circuit includes two circuits consisting of inductors and MOS transistors, and the harmonic wave termination circuit includes two LC resonant circuits consisting of capacitors, inductors, and MOS transistors. This allows the interstage impedance matching circuit and the harmonic wave termination circuit to be optimized for either of the two operating frequency bands. When there are three or more operating frequency bands, three or more interstage impedance matching circuits and three or more harmonic wave termination circuits may be provided. This allows the interstage impedance matching circuit and harmonic wave termination circuit to be optimized for any of three or more operating frequency bands.

Although a GaAs substrate is used as the compound semiconductor substrate of the first member 21 (FIG. 1) in the first example, a compound semiconductor substrate different from GaAs may be used. Although Si is used as the semiconductor layer 33 (FIG. 1) in the second member 31, an element semiconductor different from Si, such as Ge, may be used. The semiconductor material that partially constitutes the first member 21 may be a compound semiconductor material. The semiconductor material that partially constitutes the second member 31 may include other semiconductor materials such as an element semiconductor material, besides a compound semiconductor material. That is, the second member 31 may contain a semiconductor material different from the semiconductor material contained in the first member 21.

In the first example, the second conductor projection 51 (FIG. 1) protruding from the second member 31 is disposed. However, the second conductor projections 51 do not need to be provided when there is no need to electrically couple the second electronic circuit 35 (FIG. 1) provided in the second member 31 to the module substrate 100 (FIG. 2). In this case, only the first conductor projections 41 are used to mount the semiconductor device 20 on the module substrate 100.

In the semiconductor device 20 according to the first example, the first electronic circuit 25 includes a high-frequency power amplifier and the second electronic circuit 35 includes a control circuit and switching elements for the high-frequency power amplifier. The first electronic circuit 25 and the second electronic circuit 35 may be electronic circuits having other functions. Appropriate semiconductor materials may be used according to the functions of the semiconductor elements included in the first electronic circuit 25 and the second electronic circuit 35. For example, the first electronic circuit 25 may include a compound semiconductor transistor suitable for high-frequency operation. The second electronic circuit 35 may include an element semiconductor transistor suitable for a digital control circuit.

Second Example

Next, a semiconductor device according to a second example will be described with reference to FIGS. 8A to 8D. Hereinafter, description of the same configuration as that of the semiconductor device according to the first example described with reference to FIGS. 1 to 7B will be omitted. FIGS. 8A to 8D are each a cross-sectional view in each step of a manufacturing process of a semiconductor device according to the second example. Although FIG. 5A and the like only partially illustrate a wafer, the wafer is not divided into a plurality of chips in each step of the manufacturing process illustrated in FIGS. 8A to 8D.

Figures 8A, 8B, 8C, 8D:
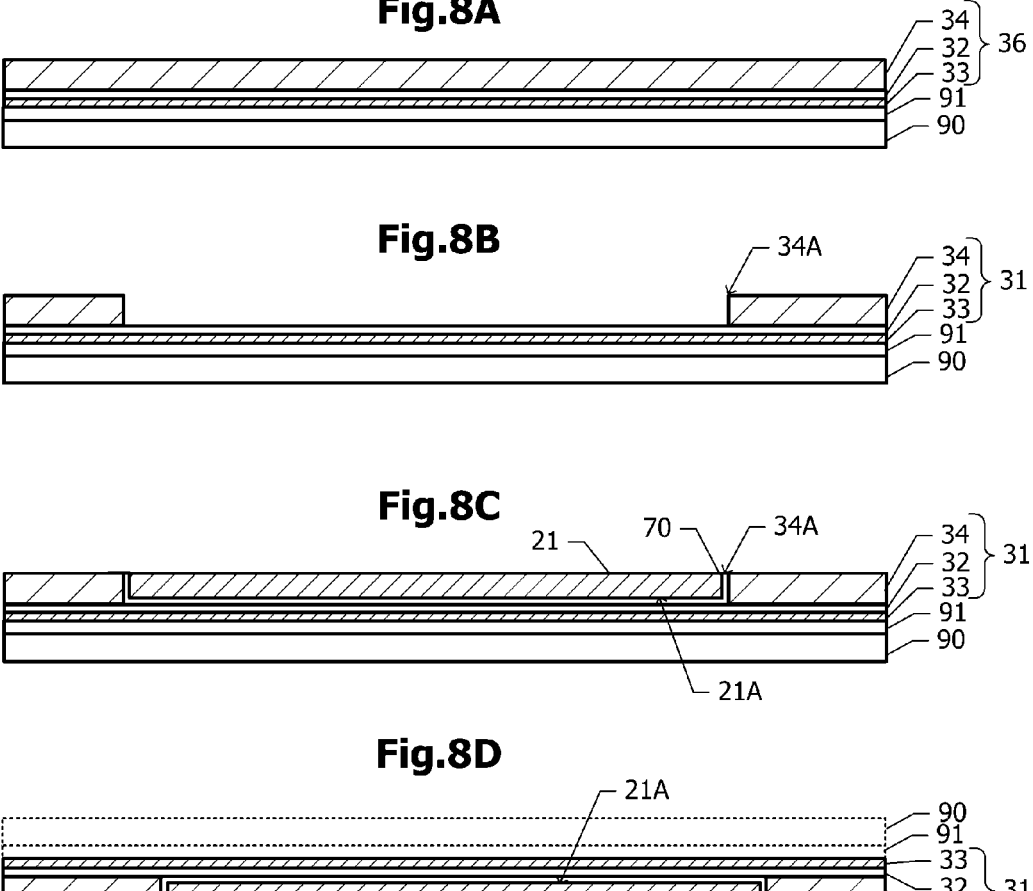
FIGS. 8A to 8D are each a cross-sectional view in each step of a manufacturing process of a semiconductor device according to a second example.

As illustrated in FIG. 8A, an SOI wafer 36 including a support substrate 34, an insulating layer 32, and a semiconductor layer 33 is bonded to a temporary substrate 90 by an adhesive layer 91. The second electronic circuit 35 and the pad 37 illustrated in FIG. 5A are formed in the step illustrated in FIG. 8A, but are omitted in FIG. 8A.

As illustrated in FIG. 8B, a recess 34A is formed by partially removing the support substrate 34 by etching. A second member 31 having the support substrate 34 partially removed is thus obtained. A photolithographic technique can be used to form the recess 34A.

As illustrated in FIG. 8C, a wafer-shaped first member 21 is disposed in the recess 34A with the first surface 21A facing the insulating layer 32, and is bonded to the insulating layer 32 by the adhesive layer 70. At this stage, the first electronic circuit 25 and pad 27 (FIG. 1) are formed in the first member 21, but are omitted in FIG. 8C.

As illustrated in FIG. 8D, the temporary substrate 90 and the adhesive layer 91 are removed by etching. In FIG. 8D, the removed temporary substrate 90 and adhesive layer 91 are indicated by the dashed line. The structure from the semiconductor layer 33 to the first member 21 in the region where the recess 34A is provided is the same as the structure illustrated in FIG. 5D. The manufacturing process after forming the structure illustrated in FIG. 8D is the same as the manufacturing process illustrated in FIGS. 6A to 7B according to the first example. The remaining portion of the support substrate 34 is removed by dicing.

Next, advantageous effects of the second example will be described.

Similarly to the first example, the second example can also achieve the effect of increasing the heat dissipation, the effect of reducing the parasitic inductance, the effect of facilitating face-down mounting, and the effect of preventing an increase in loss of the inductors in the first electronic circuit 25.

When applying the method for manufacturing a semiconductor device according to the first example described with reference to FIGS. 5A to 7B, it is necessary to set equal dimensions for the compound semiconductor wafer that serves as the base of the first member 21 and the SOI wafer 36 that serves as the base of the second member 31. The compound semiconductor wafer that serves as the base of the first member 21, however, is generally smaller than the SOI wafer 36 that serves as the base of the second member 31. The method for manufacturing a semiconductor device according to the second example can be easily applied when the compound semiconductor wafer is smaller than the SOI wafer 36.

Third Example

Next, a semiconductor device according to a third example will be described with reference to FIGS. 9 to 10D. Hereinafter, description of the same configuration as that of the semiconductor device according to the first example described with reference to FIGS. 1 to 7B will be omitted.

Figure 9:
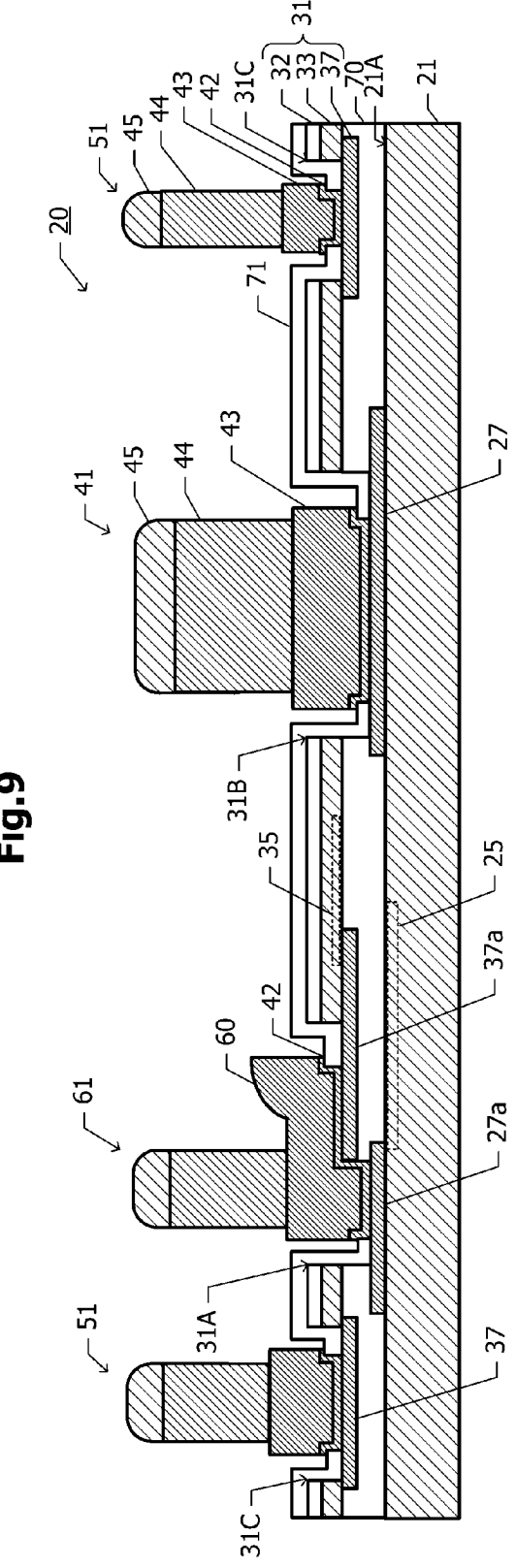
FIG. 9 is a cross-sectional view of a semiconductor device according to a third example.

FIG. 9 is a cross-sectional view of a semiconductor device 20 according to the third example. In the first example (FIG. 1), the second member 31 is bonded to the first member 21 with the adhesive layer 70 interposed therebetween with the insulating layer 32 facing the first member 21. In the third example, on the other hand, a second member 31 is bonded to a first member 21 with an adhesive layer 70 interposed therebetween with a semiconductor layer 33 facing the first member 21. A plurality of pads 37 in the second member 31 are provided on the surface of the semiconductor layer 33 facing the first member 21. A second electronic circuit 35 is provided in the surface part of the second member 31 closer to the first member 21.

In the third example (FIG. 9), a second opening 31C penetrating the insulating layer 32 and the semiconductor layer 33 in the thickness direction is provided in a region where a second conductor projection 51 is disposed. An insulating film 71 is disposed on the side and bottom surfaces of the second opening 31C. The insulating film 71 is provided with an opening in which the pad 37 is partially exposed.

The second conductor projection 51 including a seed layer 42, a base 43, a pillar 44, and a solder layer 45 is disposed on the pad 37 exposed at the bottom of the second opening 31C. The second conductor projection 51 protrudes to the outside of the second opening 31C through the second opening 31C.

A second pad 37a of the second member 31 and a first pad 27a of the first member 21 partially overlap in a plan view. An inter-member connection opening 31A is disposed at a position including at least part of the region where the first pad 27a and the second pad 37a overlap and at least part of a region of the first pad 27a that does not overlap the second pad 37a in a plan view. A portion of the second pad 37a that overlaps the first pad 27a in a plan view and a portion of the first pad 27a that does not overlap the second pad 37a in a plan view are exposed at the bottom of the inter-member connection opening 31A.

The bottom surface of the inter-member connection opening 31A has a two-step shape. The height from the first surface 21A of the first member 21 to the bottom surface where the second pad 37a is exposed is higher than the height to the bottom surface where the first pad 27a is exposed. As illustrated in FIG. 9, a portion of the second pad 37a that does not overlap the first pad 27a may be exposed at the bottom of the inter-member connection opening 31A.

The insulating film 71 is disposed on the side and bottom surfaces of the inter-member connection opening 31A. The insulating film 71 is provided with an opening in which the first pad 27a and the second pad 37a are partially exposed. The seed layer 42 and the inter-member connection wire 60 are disposed on the first pad 27a and the second pad 37a exposed at the bottom of the inter-member connection opening 31A. The first pad 27a and the second pad 37a are coupled to each other by the inter-member connection wire 60 made of a metal film.

A third conductor projection 61 is disposed on the inter-member connection wire 60. The third conductor projection 61 includes a pillar 44 and a solder layer 45 disposed thereon. In the circuit configuration of the semiconductor device 20 illustrated in FIG. 4, none of the inter-member connection wires 60a, 60b, 60c, 60d, 60e, and 60f are coupled to conductor projections. This eliminates the need to provide the third conductor projection 61 when the circuit configuration illustrated in FIG. 4 is adopted.

Next, a method for manufacturing the semiconductor device 20 according to the third example will be described with reference to FIGS. 10A to 10D. FIGS. 10A to 10D are each a cross-sectional view of the semiconductor device 20 in each step of a manufacturing process. FIGS. 10A to 10D each illustrate a state of a wafer before the wafer is divided into individual semiconductor devices 20.

Figure 10A:
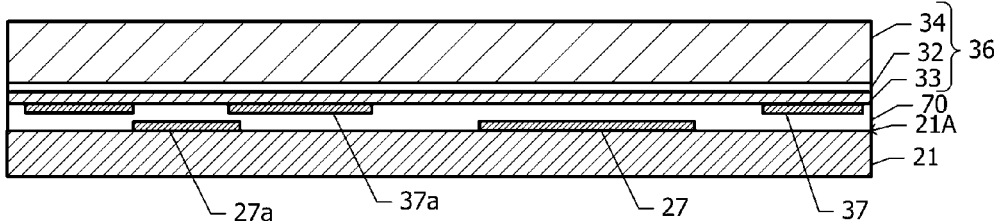
FIGS. 10A to 10D are each a cross-sectional view of the semiconductor device in each step of a manufacturing process.

As illustrated in FIG. 10A, a second electronic circuit 35 (FIG. 9) is formed on an SOI wafer 36 including a support substrate 34, an insulating layer 32, and a semiconductor layer 33. A plurality of pads 37 including a second pad 37a are formed on the surface of the semiconductor layer 33. A first electronic circuit 25 (FIG. 9) is formed in the first member 21. A plurality of pads 27 including a first pad 27a are formed on a first surface 21A. FIGS. 10A to 10D omit illustration of the first electronic circuit 25 and the second electronic circuit 35. The SOI wafer 36 is bonded to the first member 21 by an adhesive layer 70 with the surface of the SOI wafer 36, on which the pads 37 are formed, facing first surface 21A of the first member 21.

Figure 10B:
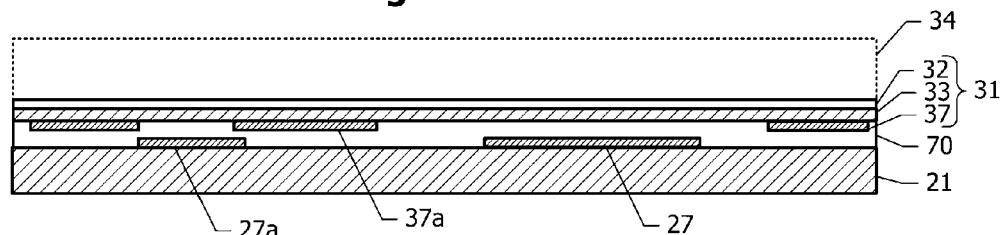

As illustrated in FIG. 10B, the support substrate 34 is removed by etching. In FIG. 10B, the removed support substrate 34 is indicated by the dashed line. The insulating layer 32 is thus exposed.

Figure 10C:
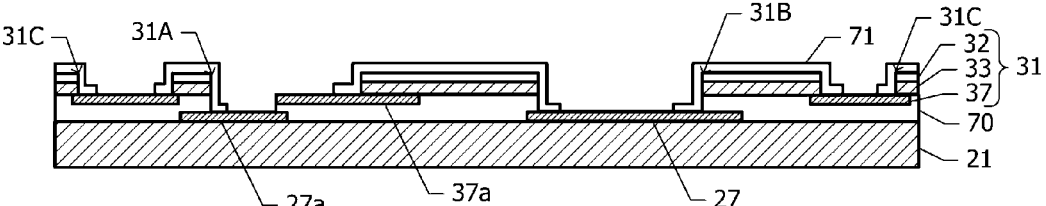

As illustrated in FIG. 10C, an inter-member connection opening 31A, a first opening 31B, and a second opening 31C are formed in the insulating layer 32, the semiconductor layer 33, and the adhesive layer 70. The inter-member connection opening 31A overlaps the first pad 27a and the second pad 37a in a plan view, reaches the second pad 37a, and reaches the first pad 27a in a region where the second pad 37a is not disposed. The insulating layer 32 and the semiconductor layer 33 are etched to expose the second pad 37a. The adhesive layer 70 in the region where the second pad 37a is not disposed is then etched using the second pad 37a as an etching stopper.

The first opening 31B penetrates the insulating layer 32, the semiconductor layer 33, and the adhesive layer 70 and reaches the pad 27 on the first member 21. The second opening 31C penetrates the insulating layer 32 and the semiconductor layer 33 and reaches the pad 37 of the second member 31.

An insulating film 71 is then deposited so as to cover the entire surface, and openings are formed in predetermined regions of the insulating film 71. Specifically, openings are formed in the bottom surface of the two-stage structure of the inter-member connection opening 31A, the bottom surface of the first opening 31B, and the bottom surface of the second opening 31C. The first pad 27a and the second pad 37a are exposed in the opening formed in the bottom surface of the inter-member connection opening 31A. The pad 27 of the first member 21 is exposed in the opening formed in the bottom surface of the first opening 31B. The pad 37 of the second member 31 is exposed in the opening formed in the bottom surface of the second opening 31C.

Figure 10D:
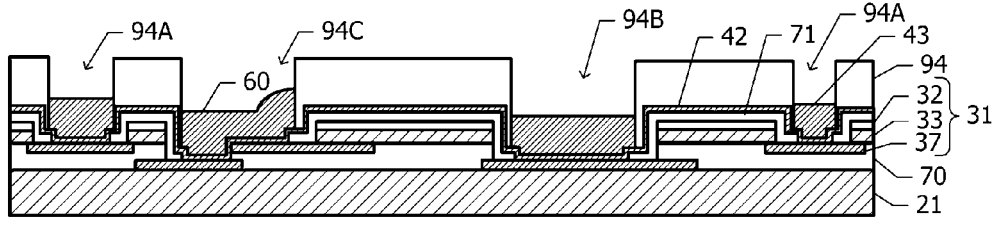

As illustrated in FIG. 10D, a seed layer 42 is deposited on the entire surface. A photosensitive plating resist film 94 is formed on the seed layer 42. By exposing and developing a predetermined region of the plating resist film 94, an opening 94A is formed in a region where a second conductor projection 51 is to be formed, an opening 94B is formed in a region where a first conductor projection 41 is to be formed, and an opening 94C is formed in a region where an inter-member connection wire 60 is to be formed.

A base 43 and the inter-member connection wire 60 are formed by plating Cu on the seed layer 42 exposed in the openings 94A, 94B, and 94C formed in the plating resist film 94. The plating resist film 94 is removed after the plating. The same steps as those after the step described with reference to FIG. 6C in the first example are then performed. The semiconductor device 20 (FIG. 9) according to the third example is thus completed.

Next, advantageous effects of the third example will be described.

Similarly to the first example, the third example can achieve the effect of increasing the heat dissipation, the effect of reducing the parasitic inductance, and the effect of preventing an increase in loss of the inductors in the first electronic circuit 25.

In the third example, the difference between the height from the first surface 21A of the first member 21 to the upper surface of the pad 27 of the first member 21 and the height of the upper surface of the pad 37 of the second member 31 is substantially only the thickness of the adhesive layer 70, which is smaller than the height difference between both in the first example. Therefore, even when the first conductor projection 41 and the second conductor projection 51 have the same laminate structure, the height difference between their top portions is reduced. This facilitates face-down mounting on the module substrate 100 (FIG. 2).

In the third example, the SOI wafer 36 before the support substrate 34 is removed in the step illustrated in FIG. 10A is bonded to the first member 21. This eliminates the need to use the temporary substrate 90 used in the steps described with reference to FIGS. 5A to 5D in the first example. This can reduce the number of manufacturing steps, thus achieving reduction in manufacturing cost.

Next, a modification of the third example will be described.

In the third example, the support substrate 34 is removed by etching in the step described with reference to FIG. 10B, leaving the insulating layer 32. Alternatively, the insulating layer 32 may be removed by etching to expose the semiconductor layer 33.

In the third example, the first conductor projection 41 and the second conductor projection 51 have the same laminate structure. This is because the height difference between the upper surfaces of the first conductor projection 41 and the second conductor projection 51 due to the thickness of the adhesive layer 70 is sufficiently small. When the adhesive layer 70 is too thick to be absorbed by the solder layer 45 during face-down mounting, the base 43 of the first conductor projection 41 may be made thicker than the base 43 of the second conductor projection 51. In order to make the base 43 of the first conductor projection 41 thicker than the base 43 of the second conductor projection 51, the plating process for forming the base 43 may be performed in two steps. For example, the plating process is performed to form the base 43 of the first conductor projection 41 and then the plating process is performed to form both the base 43 of the first conductor projection 41 and the base 43 of the second conductor projection 51.

Fourth Example

Next, a semiconductor device according to a fourth example will be described with reference to FIGS. 11 to 12D. Hereinafter, description of the same configuration as that of the semiconductor device according to the first example described with reference to FIGS. 1 to 7B will be omitted.

Figure 11:
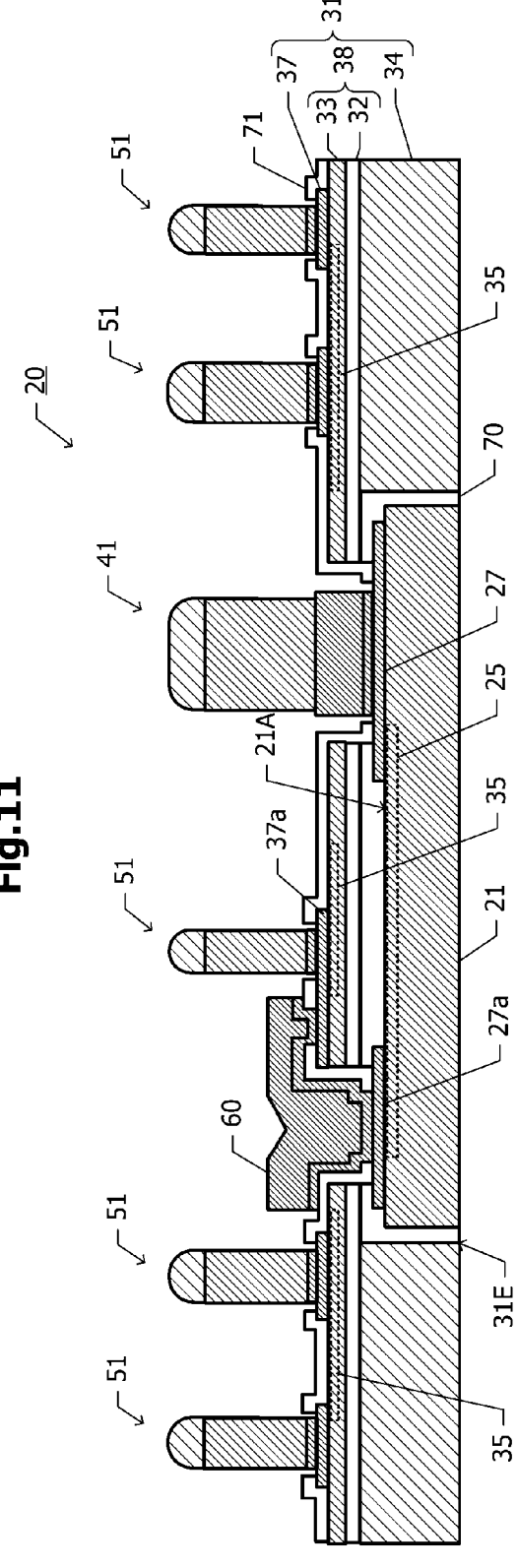
FIG. 11 is a cross-sectional view of a semiconductor device according to a fourth example.

FIG. 11 is a cross-sectional view of a semiconductor device 20 according to the fourth example. In the semiconductor device 20 (FIG. 1) according to the first example, the first member 21 and the second member 31 have the same dimensions in a plan view and have their edges aligned. On the other hand, a first member 21 is smaller than a second member 31 in the fourth example.

In the first example, the support substrate 34 (FIG. 5A) of the SOI wafer 36 is entirely removed by etching (FIG. 5B). In the fourth example, on the other hand, a recess 31E that reaches the insulating layer 32 is formed in a part of the support substrate 34 and the support substrate 34 partially remains. That is, the second member 31 includes the support substrate 34 in addition to a thin layer portion 38 including the insulating layer 32 and the semiconductor layer 33. The shape of the recess 31E in a plan view is rectangular or square, for example.

The first member 21 is disposed in the recess 31E and bonded to the side and bottom surfaces of the recess 31E by an adhesive layer 70. That is, the thin layer portion 38 is attached to the first surface 21A of the first member 21 with the adhesive layer 70 interposed therebetween. The thin layer portion 38 extends to the outside of the first member 21 in a plan view of the first surface 21A. The support substrate 34 is disposed in a region that does not overlap the first member 21 in a plan view of the first surface 21A and is bonded to the surface of the thin layer portion 38 on the side attached to the first surface 21A.

A first electronic circuit 25 is disposed in the surface part of the first member 21 facing the insulating layer 32. A plurality of pads 27 including a first pad 27a are formed on the surface facing the insulating layer 32. A second electronic circuit 35 is formed in the semiconductor layer 33 of the second member 31. A plurality of pads 37 including a second pad 37a are formed on the surface of the semiconductor layer 33.

Similarly to the first example (FIG. 1), the first pad 27a and the second pad 37a are coupled by an inter-member connection wire 60. A first conductor projection 41 that penetrates the second member 31 is disposed on the pad 27 of the first member 21. A second conductor projection 51 is disposed on the pad 37 of the second member 31. In the fourth example, the second electronic circuit 35 and the second conductor projection 51 are also disposed in a region of the semiconductor layer 33 that does not overlap the first member 21 in a plan view.

Next, a method for manufacturing the semiconductor device 20 according to the fourth example will be described with reference to FIGS. 12A to 12D. FIGS. 12A to 12D are each a cross-sectional view of the semiconductor device 20 in each step of a manufacturing process.

As illustrated in FIG. 12A, an SOI wafer 36 including a support substrate 34, an insulating layer 32, and a semiconductor layer 33 is prepared. FIG. 12A illustrates a region of the SOI wafer 36 corresponding to one semiconductor device 20. A second electronic circuit 35 (FIG. 11) is formed in the semiconductor layer 33. A plurality of pads 37 including a second pad 37a are formed on the surface of the semiconductor layer 33. The SOI wafer is bonded to a temporary substrate 90 by an adhesive layer 91 with the surface on which the pads 37 are formed facing the temporary substrate 90.

As illustrated in FIG. 12B, a recess 31E is formed in the support substrate 34 using a photolithographic technique. The recess 31E is formed for each semiconductor device 20 disposed in the SOI wafer 36. That is, a plurality of recesses 31E are formed in a single SOI wafer 36. A second member 31 is thus formed, in which the support substrate 34 partially remains. At this stage, the second member 31 is not divided into a plurality of chips.

As illustrated in FIG. 12C, the first member 21 divided into chips is disposed in the recess 31E and bonded to the second member 31 by the adhesive layer 70. A first electronic circuit 25 (FIG. 11) and a plurality of pads 27 including a first pad 27a are formed in the first member 21. The first member 21 is bonded to the second member 31 with the surface on which the pad 27 is formed facing the bottom surface of the recess 31E.

As illustrated in FIG. 12D, the temporary substrate 90 and the adhesive layer 91 are removed. The semiconductor device 20 is completed by performing the same steps as those described with reference to FIGS. 6A to 7B in the first example.

Next, advantageous effects of the fourth example will be described.

Similarly to the first example, the fourth example can achieve the effect of increasing the heat dissipation, the effect of reducing the parasitic inductance, the effect of facilitating face-down mounting, and the effect of preventing an increase in loss of the inductors in the first electronic circuit 25.

In the fourth example, the first member 21 divided into chips is bonded to the SOI wafer 36 that serves as the base of the second member 31. This eliminates the need to match the dimensions of the SOI wafer 36 and the compound semiconductor wafer that serves as the base of the first member 21. This can achieve an advantageous effect of increasing the degree of freedom of wafer selection.

In the fourth example, the second electronic circuit 35 and the second conductor projection 51 are also disposed in a region that does not overlap the first member 21 in a plan view. This can increase the area occupied by the second electronic circuit 35 without being restricted by the dimensions of the first member 21. The second electronic circuit 35 can be thus increased in scale and enhanced in function. When the dimensions of the second member 31 are predetermined, on the other hand, the dimensions of the first member 21 can be optimized independently of the dimensions of the second member 31.

Based on the above examples described herein, the following disclosure is disclosed.

<1> A semiconductor device, including a first member including a semiconductor substrate and a first electronic circuit; and a second member attached to a first surface that is one surface of the first member. The first electronic circuit includes a semiconductor element provided on one surface of the semiconductor substrate, the second member includes a second electronic circuit including another semiconductor element, and the second member is provided with a first opening that penetrates the second member in a thickness direction. The semiconductor device further includes a first conductor projection that is coupled to the first electronic circuit and protrudes from the first surface of the first member through the first opening of the second member to the outside of the first opening.

<2> The semiconductor device according to <1>, in which the semiconductor material that partially constitutes the first member is different from a semiconductor material that partially constitutes the second member.

<3> The semiconductor device according to <1> or <2>, in which the second member includes an insulating layer attached to the first member and a semiconductor layer disposed on the insulating layer, and a semiconductor element of the second electronic circuit is provided in the semiconductor layer.

<4> The semiconductor device according to <3>, in which the semiconductor layer is formed of an element semiconductor.

<5> The semiconductor device according to any one of <1> to <4>, in which the first conductor projection includes a base disposed inside the first opening and a pillar disposed on the base.

<6> The semiconductor device according to any one of <1> to <5>, in which the semiconductor element of the second electronic circuit is provided in a surface part of the second member farther away from the first member. The semiconductor device further includes a second conductor projection that is coupled to the second electronic circuit and protrudes from the second member, in which a difference in height between a top of the first conductor projection and a top of the second conductor projection is smaller than a thickness of the second member, with the first surface as a height reference.

<7> The semiconductor device according to any one of <1> to <6>, in which the first member includes a first pad disposed on the first surface and coupled to the first electronic circuit, the second member includes a second pad that is disposed on a surface facing the same direction as the first surface and coupled to the second electronic circuit, and the second member is provided with an inter-member connection opening that overlaps the first pad in a plan view and penetrates the second member in a thickness direction. The semiconductor device further includes an inter-member connection wire made of a metal film, which is coupled to the first pad through the inter-member connection opening and also to the second pad.

<8> The semiconductor device according to <7>, in which the second electronic circuit includes a switching transistor, and the inter-member connection wire couples the first electronic circuit and the switching transistor of the second electronic circuit.

<9> The semiconductor device according to any one of <1> to <5>, in which the semiconductor element of the second electronic circuit is provided in a surface part of the second member closer to the first member. The second member further includes a pad disposed on a surface facing the first member and coupled to the second electronic circuit, and the second member is provided with a second opening that is included in the pad in a plan view. The semiconductor device further includes a second conductor projection that is coupled to the pad and protrudes to the outside of the second opening through the second opening.

<10> The semiconductor device according to <9>, in which the first member includes a first pad disposed on the first surface and coupled to the first electronic circuit, the second member includes a second pad that is disposed on a surface facing the first surface and coupled to the second electronic circuit, and an inter-member connection opening is provided in the second member, in which the first pad and the second pad are exposed. The semiconductor device further includes an inter-member connection wire that is disposed inside the inter-member connection opening and is made of a metal film for connecting the first pad and the second pad.

<11> The semiconductor device according to <10>, in which the second electronic circuit includes a switching transistor, and the inter-member connection wire couples the first electronic circuit to the switching transistor of the second electronic circuit.

<12> The semiconductor device according to <11>, in which the first electronic circuit includes at least two passive elements, at least two switching transistors are included in the second electronic circuit, the switching transistor of the second electronic circuit is coupled in series to each of the passive elements, and two series connection circuits including the passive elements and the switching transistor are coupled in parallel.

<13> The semiconductor device according to <11> or <12>, in which the first electronic circuit includes a plurality of diodes coupled in multiple stages, and the switching transistor is coupled in parallel to some of the plurality of diodes.

<14> The semiconductor device according to any one of <1> to <13>, in which the first electronic circuit includes at least one inductor, and the second member is removed from at least a part of a region overlapping the at least one inductor in the first electronic circuit in a plan view.

<15> The semiconductor device according to any one of <1> to <14>, in which the first electronic circuit includes a high-frequency power amplifier, and the second electronic circuit includes a control circuit that controls the first electronic circuit.

<16> The semiconductor device according to any one of <1> to <15>, in which the semiconductor substrate included in the first member is a compound semiconductor substrate.

<17> The semiconductor device according to any one of <1> to <16>, in which the second member is thinner than the first member.

<18> The semiconductor device according to any one of <1> to <8>, in which the second member includes a thin layer portion attached to the first surface and a support substrate bonded to the thin layer portion, the thin layer portion extends to the outside of the first member in a plan view of the first surface, and the support substrate is bonded to a surface of the thin layer portion on the side attached to the first surface.

It goes without saying that the aforementioned examples are illustrative only, and partial substitutions or combinations of the configurations illustrated in the different examples are possible. Similar effects with similar configurations of the examples are not described for each example. The present disclosure is not limited to the examples described above. For example, it will be apparent to those skilled in the art that various changes, modifications, combinations, and the like are possible.

What is claimed is:

1. A semiconductor device, comprising:
    a first member including a semiconductor substrate and a first electronic circuit, the first electronic circuit including a semiconductor element on one surface of the semiconductor substrate;

a second member attached to a first surface that is one surface of the first member, the second member including a second electronic circuit including another semiconductor element, and the second member has a first opening that penetrates the second member in a thickness direction; and a first conductor projection that is coupled to the first electronic circuit and protrudes from the first surface of the first member through the first opening of the second member to outside of the first opening.

2. The semiconductor device according to claim 1, wherein a semiconductor material that partially configures the first member is different from a semiconductor material that partially configures the second member.

3. The semiconductor device according to claim 1, wherein the second member includes an insulating layer attached to the first member and a semiconductor layer on the insulating layer, and a semiconductor element of the second electronic circuit is in the semiconductor layer.

4. The semiconductor device according to claim 3, wherein the semiconductor layer includes an element semiconductor.

5. The semiconductor device according to claim 1, wherein the first conductor projection includes a base inside the first opening and a pillar on the base.

6. The semiconductor device according to claim 1, wherein the semiconductor element of the second electronic circuit is in a surface part of the second member farther away from the first member, and the semiconductor device further comprises:

a second conductor projection that is coupled to the second electronic circuit and protrudes from the second member, wherein a difference in height between a top of the first conductor projection and a top of the second conductor projection is smaller than a thickness of the second member, with the first surface as a height reference.

7. The semiconductor device according to claim 1, wherein the first member includes a first pad on the first surface and coupled to the first electronic circuit, the second member includes a second pad that is on a surface facing a same direction as the first surface and coupled to the second electronic circuit, and the second member has an inter-member connection opening that overlaps the first pad in a plan view and penetrates the second member in a thickness direction, and the semiconductor device further comprises:

an inter-member connection wire made of a metal film, which is coupled to the first pad through the inter-member connection opening and also to the second pad.

8. The semiconductor device according to claim 7, wherein the second electronic circuit includes a switching transistor, and the inter-member connection wire couples the first electronic circuit and the switching transistor of the second electronic circuit.

9. The semiconductor device according to claim 1, wherein the semiconductor element of the second electronic circuit is in a surface part of the second member closer to the first member, the second member further includes a pad on a surface facing the first member and coupled to the second electronic circuit, and the second member has a second opening that is included in the pad in a plan view, and the semiconductor device further comprises:

a second conductor projection that is coupled to the pad and protrudes to the outside of the second opening through the second opening.

10. The semiconductor device according to claim 9, wherein the first member includes a first pad on the first surface and coupled to the first electronic circuit, the second member includes a second pad that is on a surface facing the first surface and coupled to the second electronic circuit, and an inter-member connection opening is in the second member, in which the first pad and the second pad are exposed, and the semiconductor device further comprises:

an inter-member connection wire that is inside the inter-member connection opening and is made of a metal film for connecting the first pad and the second pad.

11. The semiconductor device according to claim 10, wherein the second electronic circuit includes a switching transistor, and the inter-member connection wire couples the first electronic circuit to the switching transistor of the second electronic circuit.

12. The semiconductor device according to claim 11, wherein the first electronic circuit includes at least two passive elements, at least two switching transistors are included in the second electronic circuit, the switching transistor of the second electronic circuit is coupled in series to each of the passive elements, and two series connection circuits including the passive elements and the switching transistor are coupled in parallel.

13. The semiconductor device according to claim 11, wherein the first electronic circuit includes a plurality of diodes coupled in multiple stages, and the switching transistor is coupled in parallel to some of the plurality of diodes.

14. The semiconductor device according to claim 1, wherein the first electronic circuit includes at least one inductor, and the second member is removed from at least a part of a region overlapping the at least one inductor in the first electronic circuit in a plan view.

15. The semiconductor device according to claim 1, wherein the first electronic circuit includes a high-frequency power amplifier, and the second electronic circuit includes a control circuit that controls the first electronic circuit.

16. The semiconductor device according to claim 1, wherein the semiconductor substrate included in the first member is a compound semiconductor substrate.

17. The semiconductor device according to claim 1, wherein the second member is thinner than the first member.

18. The semiconductor device according to claim 1, wherein the second member includes a thin layer portion attached to the first surface and a support substrate bonded to the thin layer portion, the thin layer portion extends to the outside of the first member in a plan view of the first surface, and the support substrate is bonded to a surface of the thin layer portion on a side attached to the first surface.

19. The semiconductor device according to claim 2, wherein the second member includes an insulating layer attached to the first member and a semiconductor layer on the insulating layer, and a semiconductor element of the second electronic circuit is in the semiconductor layer.

20. The semiconductor device according to claim 2, wherein the first conductor projection includes a base inside the first opening and a pillar on the base.

* * * * *